(12) United States Patent
Lee (10) Patent No.: US 7,002,858 B2
(45) Date of Patent: Feb. 21, 2006

(54) SEMICONDUCTOR MEMORY DEVICE WHICH SELECTIVELY CONTROLS A LOCAL INPUT/OUTPUT LINE SENSE AMPLIFIER

(75) Inventor: Dong-Su Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/892,361

(22) Filed: Jul. 16, 2004

(65) Prior Publication Data

US 2005/0018511 A1    Jan. 27, 2005

(30) Foreign Application Priority Data

Jul. 24, 2003  (KR) .................. 10-2003-0051119

(51) Int. Cl.
*G11C 7/00* (2006.01)
(52) U.S. Cl. .................. 365/200; 365/207; 365/210
(58) Field of Classification Search ............... 365/200, 365/207, 210
See application file for complete search history.

(56) References Cited

U.S. PATENT DOCUMENTS 6,745,354 B1 * 6/2004 Terzioglu .................. 714/710
6,888,778 B1 * 5/2005 Terzioglu et al. ......... 365/230.06

* cited by examiner

*Primary Examiner*—Richard Elms
*Assistant Examiner*—N. Nguyen
(74) *Attorney, Agent, or Firm*—Volentine Francos & Whitt PLLC (57) ABSTRACT

A semiconductor memory device in which a local input/output line sense amplifier may be selectively enabled or disabled. The semiconductor memory device may include a memory cell array block, a redundancy circuit, a switch unit, and/or a control unit. The memory cell array block may include a local input/output line sense amplifier that operates in response to a sense amplifier enable signal. The redundancy circuit may include a redundancy local input/output line sense amplifier that operates in response to the sense amplifier enable signal. The switch unit may selectively output data output from the local input/output line sense amplifier or the redundancy local input/output line sense amplifier, in response to a first select signal and a second select signal. If the redundancy circuit operates, the control unit may generate, in response to the second select signal, a sense amplifier operation control signal that disables the local input/output line sense amplifier. Since the semiconductor memory device selectively enables or disables the local input/output line sense amplifier, unnecessary current consumption caused due to dummy sensing is avoided.

25 Claims, 11 Drawing Sheets

SEMICONDUCTOR MEMORY DEVICE WHICH SELECTIVELY CONTROLS A LOCAL INPUT/OUTPUT LINE SENSE AMPLIFIER

BACKGROUND OF THE INVENTION

1. Field of the Invention

Embodiments of the present invention relate to a semiconductor memory device which selectively controls a local input/output sense amplifier.

This application claims the priority of Korean Patent Application No. 2003-51119, filed on Jul. 24, 2003, in the Korean Intellectual Property Office, the disclosure of which is incorporated herein in its entirety by reference.

2. Description of the Related Art

Semiconductor memory devices which include a plurality of input/output (I/O) buses (e.g. Rambus Dynamic Random Access Memories (RDRAMs)), employ a data line redundancy circuit to repair faults in a memory cell to increase efficiency in column redundancy. Semiconductor memory devices which operate with low power voltage and high operating frequency may include a local input/output sense amplifier. Semiconductor memory devices may have a column matrix structure (in which elements are arranged in columns) to minimize faults due to the high density of elements.

Figure 1:
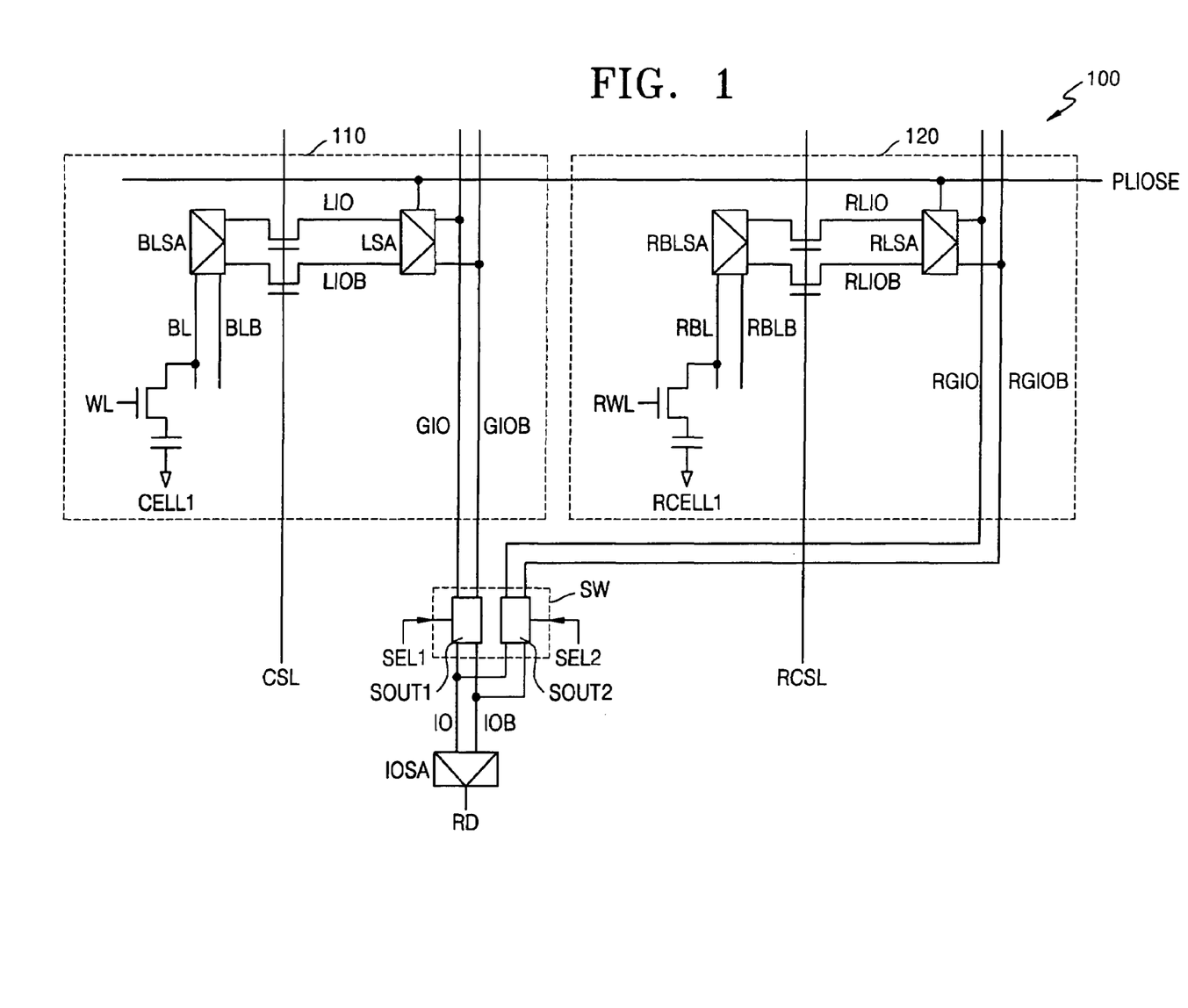
FIG. 1 is a circuit diagram of a semiconductor memory device comprising a local input/output sense amplifier and a data line redundancy circuit.

FIG. 1 is a circuit diagram of a semiconductor memory device including a local input/output sense amplifier and a data line redundancy circuit. A semiconductor memory device 100 includes a memory cell array block 110, a redundancy circuit 120, a switch unit SW, and an input/output sense amplifier IOSA. The memory cell array block 110 and the redundancy circuit 120 are located on an array and the switch unit SW and the input/output sense amplifier IOSA are located on a peripheral portion.

The memory cell array block 110 may perform a read operation. A row address is first applied to the memory cell array block 110 to enable a word line WL and a bit line sense amplifier BLSA amplifies a charge stored in a cell capacitor. If a read command and a column address are applied to the memory cell array block 110, a column select line CSL is enabled and data amplified in a bit line BL and an inverted bit line BLB is transmitted to a local input/output sense amplifier LSA. If a local input/output sense amplifier enable signal PLIOSE is applied to the local input/output sense amplifier LSA, the data is amplified once more and loaded on a global input/output line GIO and an inverted global input/output line GIOB.

The data loaded on the pair of global input/output lines GIO and GIOB is amplified to a complementary metal oxide semiconductor (CMOS) level at a terminal end of the pair of global input/output lines GIO and GIOB by the input/output sense amplifier IOSA. The data is then forwarded to a pipe line (not shown) and transmitted to the outside of the memory cell array block 110 through a series of pipe lines (not shown), an output driver (not shown), and a DQ pin. The switch unit SW selectively outputs data loaded on the pair of global input/output lines GIO and GIOB in response to a first select signal SEL1 or data loaded on a pair of redundancy global input/output lines RGIO and RGIOB in response to a second select signal SEL2.

A read operation of the redundancy circuit 120 is similar to the memory cell array block 110. The redundancy circuit 120 includes a redundancy cell RCELL1, a redundancy bit line RBL, an inverted redundancy bit line RBLB, a redundancy bit line sense amplifier RBLSA, a redundancy local input/output line RLIO, an inverted redundancy local input/output line RLIOB, a redundancy local input/output sense amplifier RLSA, the redundancy global input/output line RGIO, and the inverted redundancy global input/output line RGIOB. The switch unit SW selects one path between the pair of global input/output lines GIO and GIOB and the pair of redundancy global input/output lines RGIO and RGIOB.

Figure 2:
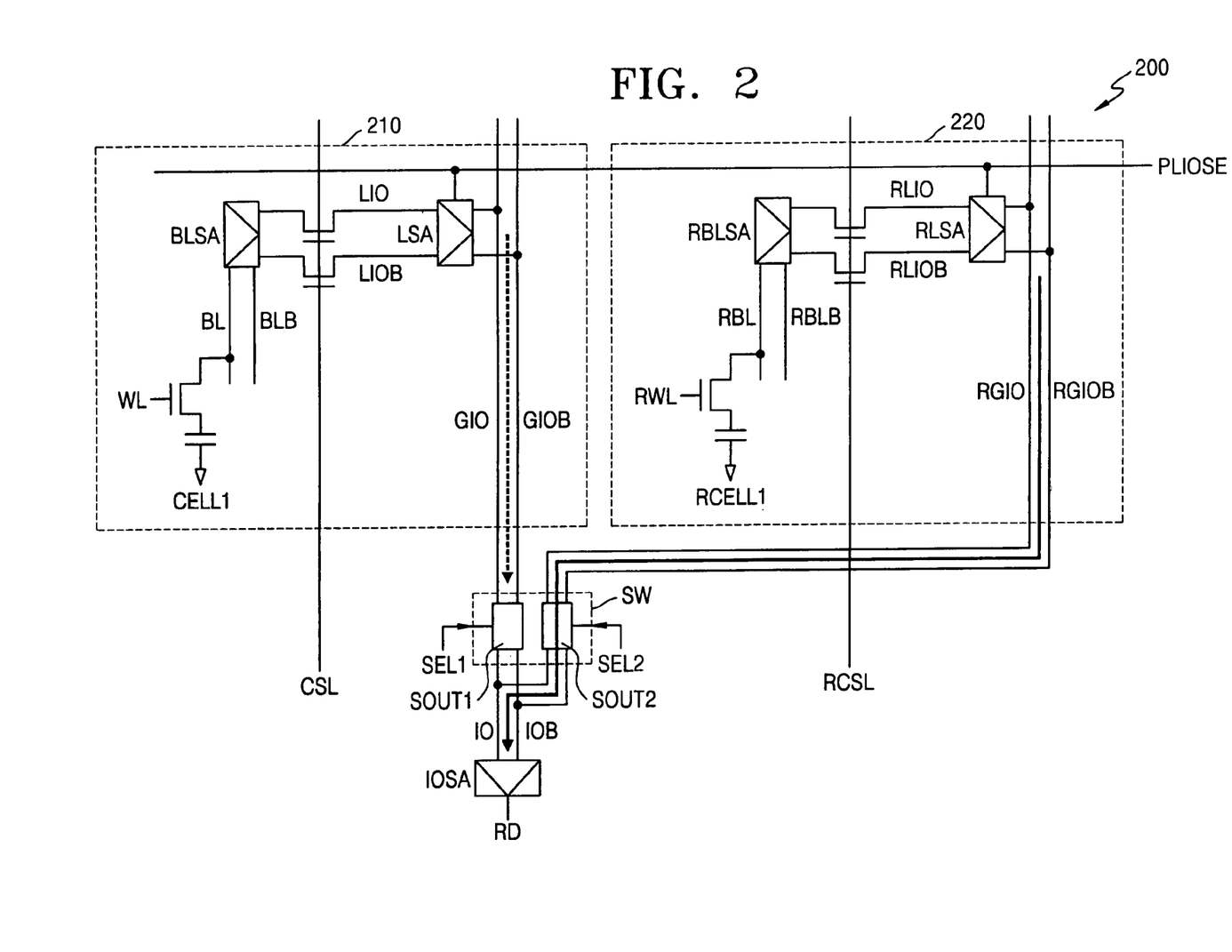
FIG. 2 is a circuit diagram of a redundancy circuit in a semiconductor memory device.

FIG. 2 is a circuit diagram of a redundancy circuit in the semiconductor memory device of FIG. 1. If a redundancy column select line RCSL is enabled, data amplified by a redundancy word line RWL and a redundancy bit line sense amplifier RBLSA is transmitted to a redundancy local input/output line RLIO and an inverted redundancy local input/output line RLIOB. The data is then amplified by a local input/output line sense amplifier RLSA. The data is then loaded on a redundancy global input/output line RGIO and an inverted redundancy global input/output line RGIOB. If a second select signal SEL2 is enabled and a first select signal SEL1 is disabled, the data loaded on the pair of redundancy global input/output line RGIO and RGIOB is applied to an input/output sense amplifier IOSA.

A local input/output sense amplifier enable signal PLIOSE includes column address strobe (CAS) command read information and block code information. PLIOSE is connected to a memory cell array block 210, such that the local input/output sense amplifier enable signal PLIOSE can enable both a local input/output sense amplifier LSA (of the memory cell array block 210) and the redundancy local input/output sense amplifier RLSA (of a redundancy circuit 220). Accordingly, when the redundancy circuit 220 performs a sensing function, the local input/output sense amplifier LSA of the memory cell array block 210 performs a dummy sensing function, which causes unnecessary current consumption.

Figure 3:
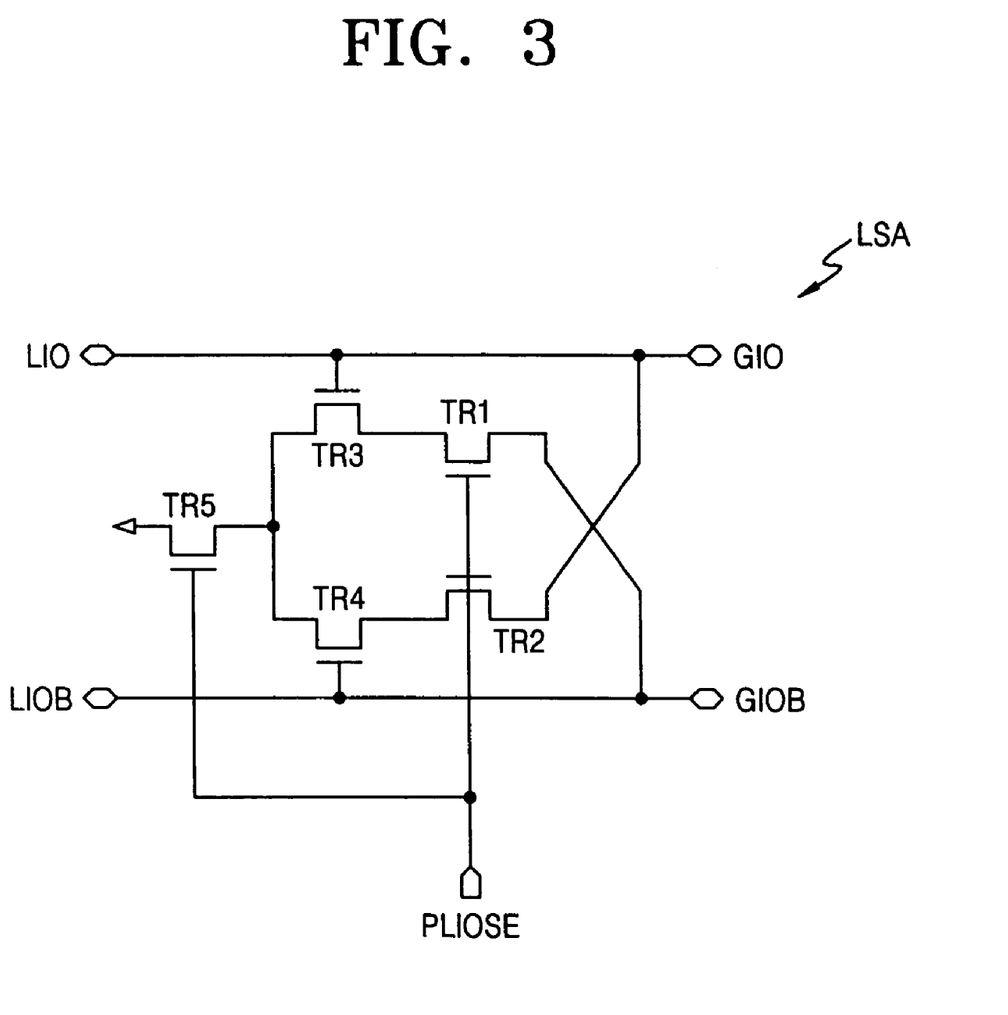
FIG. 3 is a circuit diagram of a local input/output line sense amplifier.

FIG. 3 is a circuit diagram of a local input/output line sense amplifier of FIGS. 1 and 2. If data of a high level is loaded on a local input/output line LIO and data of a low level is loaded on an inverted local input/output line LIOB, then a third transistor TR3 is turned on and a fourth transistor TR4 is turned off.

If a local input/output line sense amplifier enable signal PLIOSE is applied at a high level, then first, second, and fifth transistors TR1, TR2, and TR5 are turned on. As a result, a global input/output line GIO increases to a high level and an inverted global input/output line GIOB decreases to a low level. Since the local input/output line sense amplifier LSA and a redundancy local input/output line sense amplifier RLSA have the same structure, both the local input/output line sense amplifier LSA and the redundancy local input/output line sense amplifier RLSA are turned on if the local input/output line sense amplifier enable signal PLIOSE is enabled.

Figure 4:
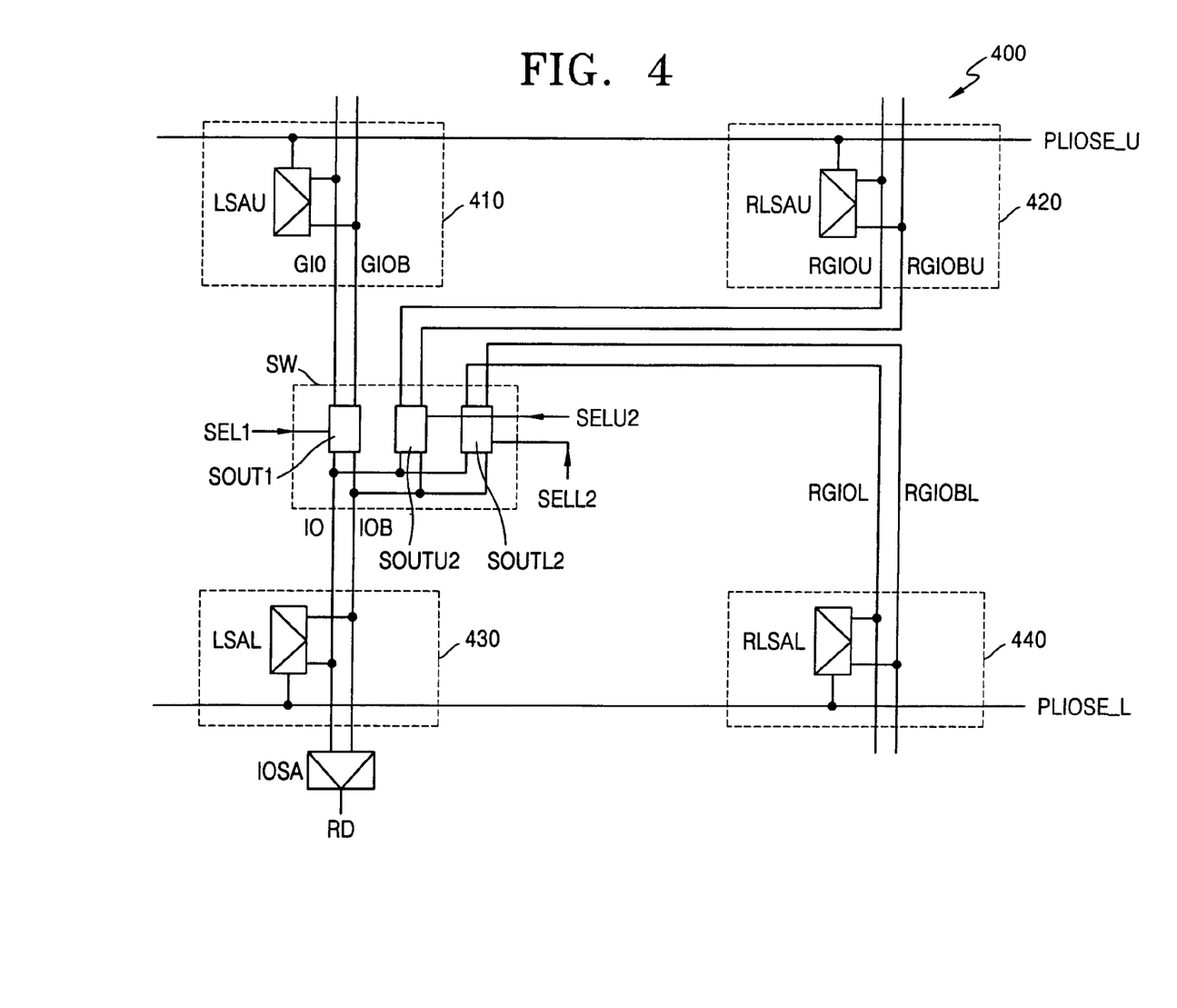
FIG. 4 is a circuit diagram of a memory cell array block and a redundancy circuit in a memory device having a column matrix structure.

FIG. 4 is a circuit diagram of a memory cell array block and a redundancy circuit of a semiconductor memory device which has a column matrix structure. A cell, a word line, a pair of bit lines, and a pair of local input/output lines are not shown for simplification. A memory cell array block is divided into an upper memory cell array block 410 and a lower memory cell array block 430. The upper memory cell array block 410 includes a global input/output line GIO, an inverted global input/output line GIOB, and an upper local input/output line sense amplifier LSAU for reading data. The lower memory cell array block 430 includes a lower local input/output line sense amplifier LSAL, an input/output line IO, and an inverted input/output line IOB.

An inverted circuit is divided into an upper redundancy circuit 420 and a lower redundancy circuit 440. The pair of input/output lines IO and IOB of the lower memory cell array block 430 are used as a default path through which data sensed by the upper memory cell array block 410, the upper redundancy circuit 420, and the lower redundancy circuit 440 is applied to an input/output sense amplifier IOSA.

To use the pair of input/output lines IO and IOB of the lower memory cell array block 430 as the default path, a switch unit SW is required for selecting one of the pair of global input/output lines GIO and GIOB, a pair of upper redundancy global input/output lines RGIOU and RGIOBU, and a pair of lower redundancy global input/output lines RGIOL and RGIOBL.

Figure 5:
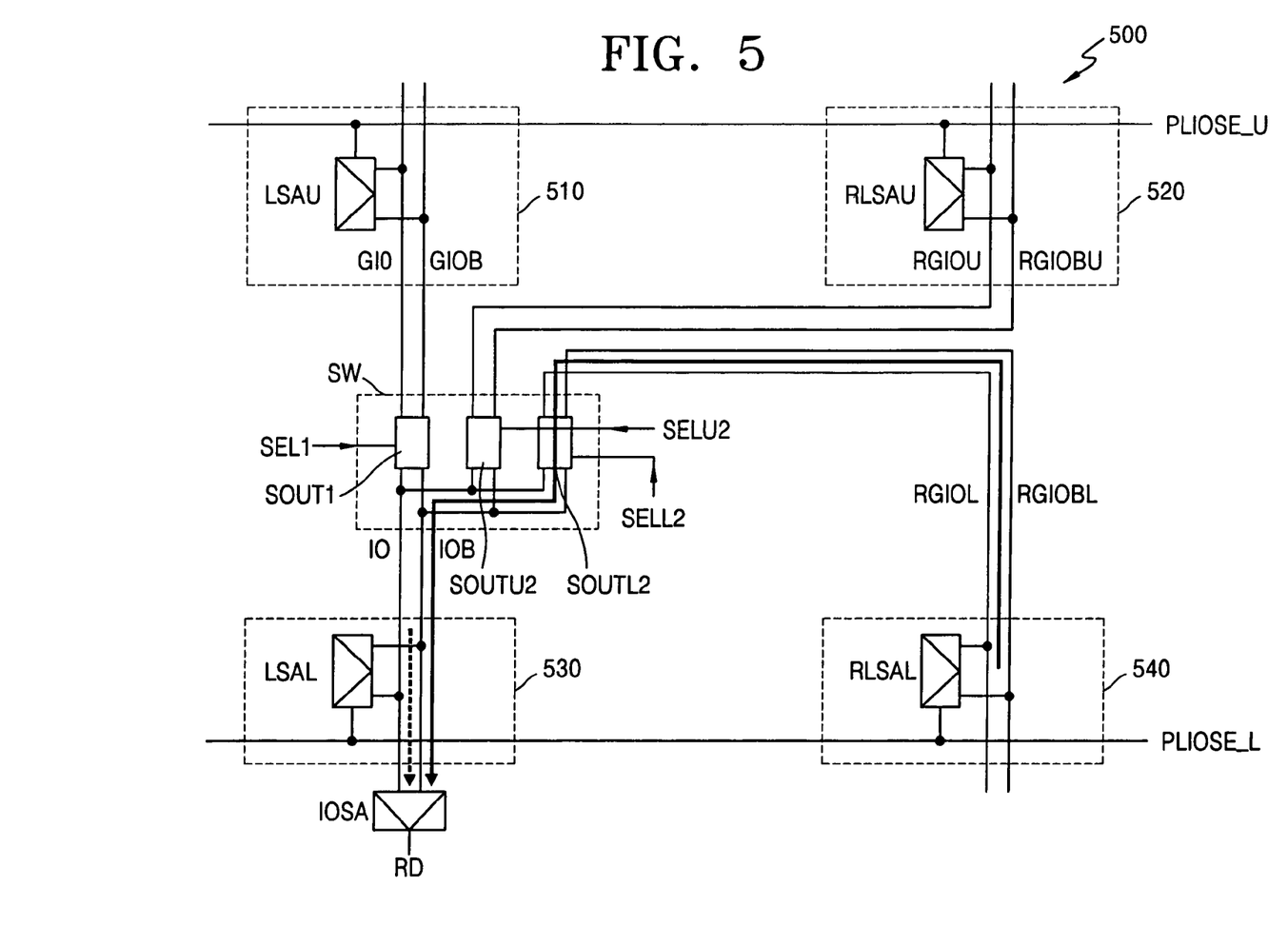
FIG. 5 is a circuit diagram of a lower redundancy circuit in a semiconductor memory device.

FIG. 5 is a circuit diagram of a lower redundancy circuit in a semiconductor memory device of FIG. 4. To connect a lower redundancy circuit 540 to a pair of input/output lines IO and IOB, a first select signal SEL1 and a second upper select signal SELU2 are disabled and a second lower select signal SELL2 is enabled.

If a lower sense amplifier enable signal PLIOSE_L is applied, a lower redundancy local input/output line sense amplifier RLSAL is enabled to perform a sensing function. At the same time, a lower local input/output line sense amplifier LSAL of a lower memory cell array block 530 is also enabled and performs a dummy sensing function. Accordingly, both data sensed by the lower redundancy local input/output line sense amplifier RLSAL and invalid data dummy sensed by the lower local input/output line sense amplifier LSAL are disadvantageously loaded on the pair of input/output lines IO and IOB.

Figure 6A:
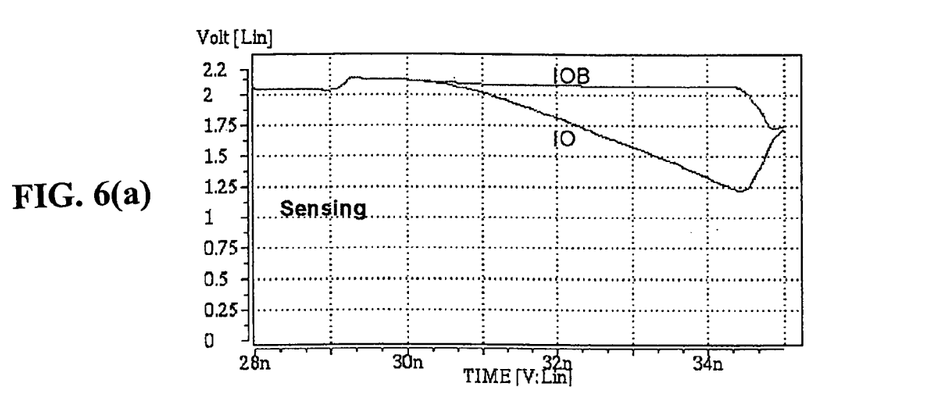
FIG. 6A is a graph illustrating a waveform of a pair of input/output lines when a lower redundancy circuit performs a sensing function.
Figure 6B:
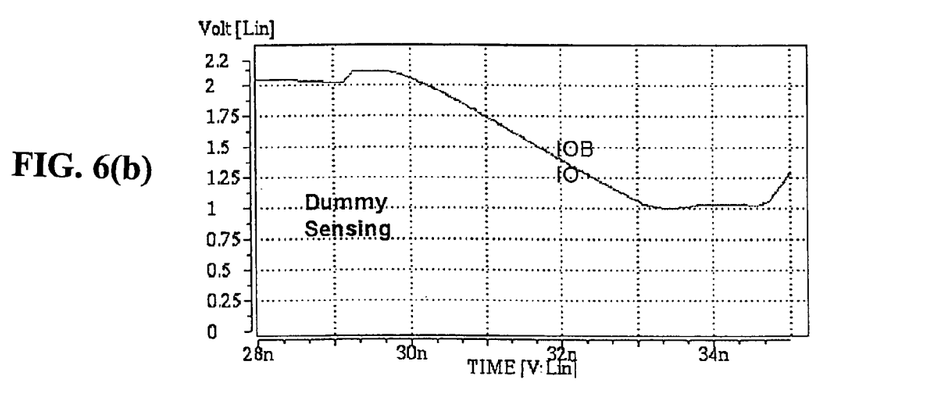
FIG. 6B is a graph illustrating a waveform of a pair of input/output lines when a local input/output line sense amplifier of a lower memory cell array block performs a dummy sensing function.
Figure 6C:
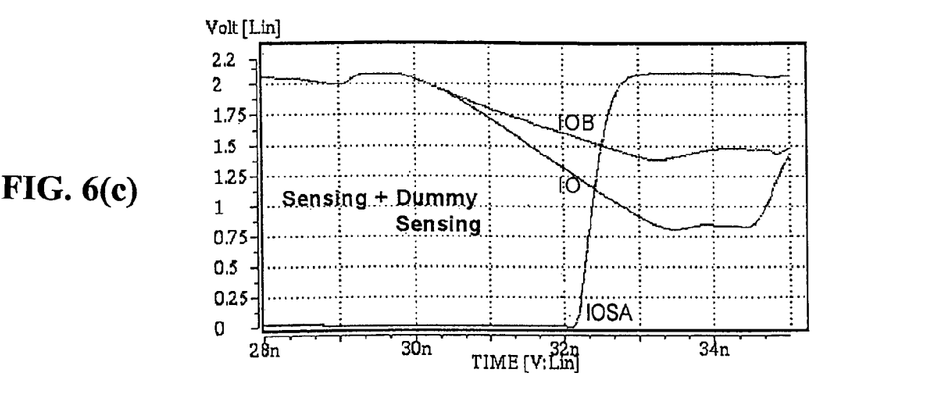
FIG. 6C is a graph illustrating a waveform of a pair of input/output lines when a lower redundancy circuit and a lower local input/output line sense amplifier of a lower memory cell array block operate together.

FIG. 6A is a graph illustrating a waveform of a pair of input/output lines when a lower redundancy circuit of FIG. 4 performs a sensing function. FIG. 6B is a graph illustrating a waveform of a pair of input/output lines when a local input/output line sense amplifier of a lower memory cell array block of FIG. 4 performs a dummy sensing function. FIG. 6C is a graph illustrating a waveform of a pair of input/output lines when a lower redundancy circuit and a lower local input/output line sense amplifier of a lower memory cell array block of FIG. 4 operate together.

Referring to FIG. 6C, when the lower local input/output line sense amplifier performs the dummy sensing function operates together with the lower redundancy circuit, a voltage level of a pair of input/output lines IO and IOB decreases, as compared with the graph of FIG. 6A. This causes a decrease in the voltage level input to an input/output line sense amplifier IOSA, reducing sensing speed of the input/output line sense amplifier IOSA.

SUMMARY OF THE INVENTION

Embodiments of the present invention relate to a semiconductor memory device in which a local input/output line sense amplifier can be selectively enabled or disabled. According to aspects of embodiments of the present invention, a semiconductor memory device comprises a memory cell array block, a redundancy circuit, a switch unit, and a control unit. The memory cell array block includes a local input/output line sense amplifier that operates in response to a sense amplifier enable signal. The redundancy circuit includes a redundancy local input/output line sense amplifier that operates in response to the sense amplifier enable signal. The switch unit selectively outputs data output from the local input/output line sense amplifier or the redundancy local input/output line sense amplifier in response to a first select signal and a second select signal. If the redundancy circuit operates, the control unit generates (in response to the second select signal) a sense amplifier operation control signal that disables the local input/output line sense amplifier.

If the redundancy circuit does not operate, the control unit may generate (in response to the second select signal) a redundancy sense amplifier operation control signal that disables the redundancy local input/output line sense amplifier. The redundancy sense amplifier operation control signal may have the same logic level as the second select signal. The redundancy sense amplifier operation control signal may be applied to the redundancy local input/output line sense amplifier via a transmission line located on the redundancy circuit. The first select signal may have the opposite logic level as the second select signal. The second select signal may be a column redundancy enable signal. The sense amplifier operation control signal may have the opposite logic level as the second select signal.

The switch unit may include a first output unit and a second output unit, the first output unit may output or cut off the data output from the local input/output sense amplifier in response to the first select signal. The second output unit may output or cut off the data output from the redundancy local input/output sense amplifier in response to the second select signal. The sense amplifier operation control signal may be applied to the local input/output line sense amplifier via a transmission line located on the memory cell array block.

According to aspects of embodiments of the present invention, a semiconductor memory device comprises an upper memory cell array block, an upper redundancy circuit, a lower memory cell array block, a lower redundancy circuit, a switch unit, and a control unit.

The upper memory cell array block may include an upper local input/output line sense amplifier which operates in response to an upper sense amplifier enable signal. The upper redundancy circuit may include an upper redundancy local input/output line sense amplifier which operates in response to the upper sense amplifier enable signal. The lower memory cell array block may include a lower local input/output line sense amplifier that operates in response to a lower sense amplifier enable signal. The lower redundancy circuit may include a lower redundancy local input/output line sense amplifier that operates in response to the lower sense amplifier enable signal. The switch unit may selectively output data output from the upper local input/output line sense amplifier, the upper redundancy local input/output line sense amplifier, or the lower redundancy local input/output line sense amplifier in response to a first select signal, a second upper select signal, and a second lower select signal. If the upper redundancy circuit operates, the control unit may generate (in response to the second upper select signal) an upper sense amplifier operation control signal that disables the upper local input/output line sense amplifier. If the lower redundancy circuit operates, the control unit may generate (in response to the second lower select signal a lower sense amplifier operation control signal that disables the lower local input/output line sense amplifier.

If the upper memory cell array block operates, the control unit may generate (in response to the second upper select signal) an upper redundancy sense amplifier operation control signal that disables the upper redundancy local input/output line sense amplifier. If the lower memory cell array block operates, the control unit may generate (in response to the second lower select signal) a lower redundancy sense amplifier operation control signal that disables the lower redundancy local input/output line sense amplifier.

According to aspects of embodiments of the present invention, a semiconductor memory device comprises an upper memory cell array block, an upper redundancy circuit, a lower memory cell array block, a lower redundancy circuit, and a switch unit.

The upper memory cell array block includes an upper local input/output line sense amplifier which operates in response to an upper sense amplifier enable signal. The redundancy circuit includes an upper redundancy local input/output line sense amplifier which operates in response to the upper sense amplifier enable signal. The lower memory cell array block outputs stored data to an input/output line. The lower redundancy circuit includes a lower redundancy local input/output line sense amplifier which operates in response to the lower sense amplifier enable signal. The switch unit selectively outputs data output from the upper local input/output line sense amplifier, the upper redundancy local input/output line sense amplifier, or the lower redundancy local input/output line sense amplifier in response to a first select signal, a second upper select signal, and a second lower select signal. A local input/output line is directly connected to the input/output line.

In embodiments, the semiconductor memory device may include a control unit, which generates (in response to the second upper select signal) an upper sense amplifier operation control signal that disables the upper local input/output line sense amplifier, if the upper redundancy circuit operates. If one of the first select signal, the second upper select signal, and the second lower select signal is at a first level, the other two signals may be at a second level, and the upper sense amplifier operation control signal may have the opposite logic level to that of the second upper select signal.

If the upper memory cell array block operates, the control unit may generate (in response to the second upper select signal) an upper redundancy sense amplifier operation control signal that disables the upper redundancy local input/output line sense amplifier. If the lower memory cell array block operates, the control unit may generate (in response to the second lower select signal) a lower redundancy sense amplifier operation control signal that disables the lower redundancy local input/output line sense amplifier.

BRIEF DESCRIPTION OF THE DRAWINGS

Example

Example

Example

Example

Example

DETAILED DESCRIPTION OF THE INVENTION

Figure 7:
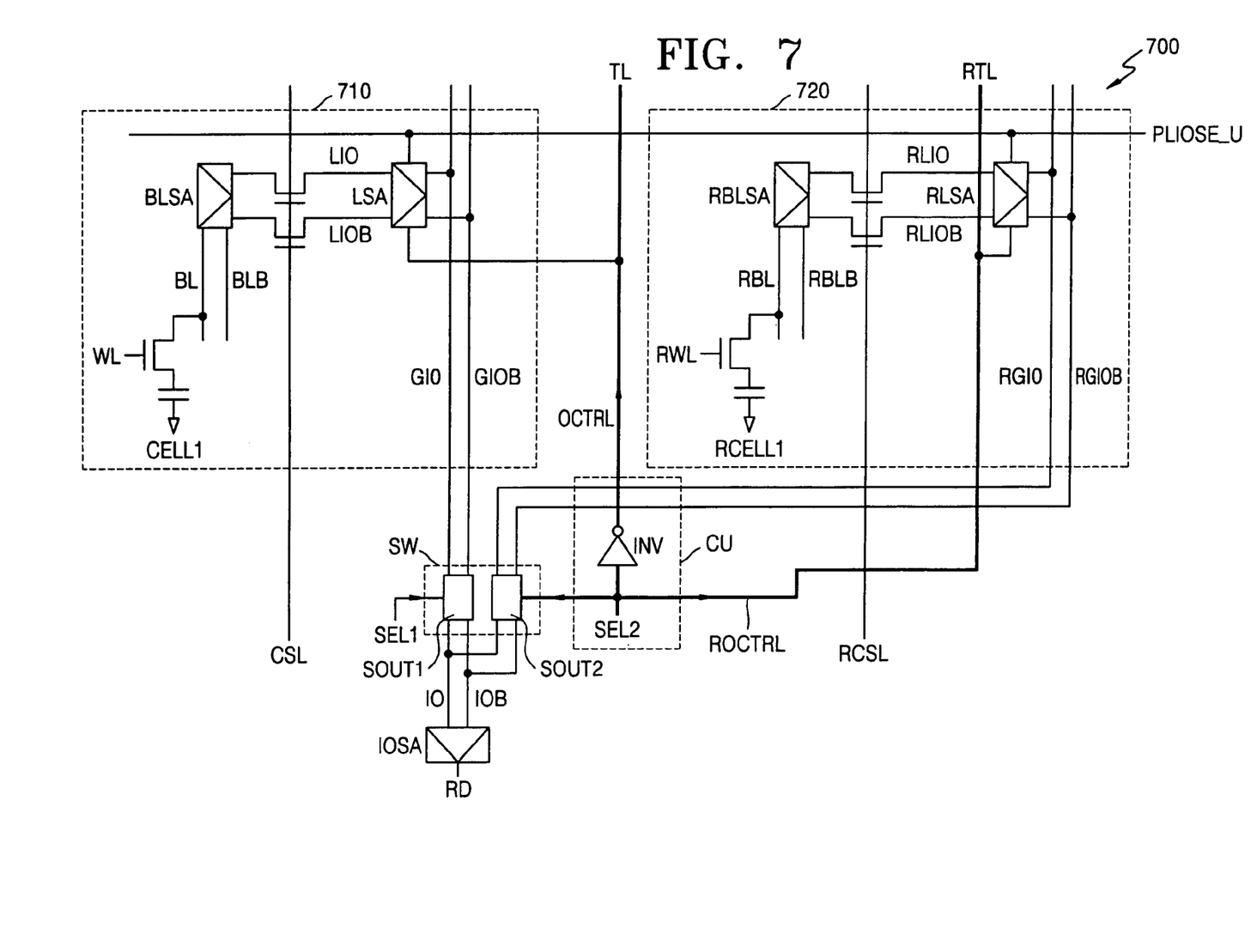
FIG. 7 is a circuit diagram of a semiconductor memory device.

Example FIG. 7 is a circuit diagram of a semiconductor memory device, according to embodiments of the present invention. A semiconductor memory device 700 includes a memory cell array block 710, a redundancy circuit 720, a switch unit SW, and a control unit CU.

The memory cell array block 710 includes a local input/output line sense amplifier LSA (that operates in response to a sense amplifier enable signal PLIOSE) and a bit line sense amplifier BLSA. The local input/output line sense amplifier LSA and the bit line sense amplifier BLSA are connected to each other by a local input/output line LIO and an inverted local input/output line LIOB.

The redundancy circuit 720 includes a redundancy local input/output line sense amplifier RLSA (that operates in response to the sense amplifier enable signal PLIOSE) and a redundancy bit line sense amplifier RBLSA. The redundancy local input/output line sense amplifier RLSA and the redundancy bit line sense amplifier RBLSA are connected to each other by a redundancy local input/output line RLIO and an inverted redundancy local input/output line RLIOB.

The switch unit SW selectively outputs data output from the local input/output line sense amplifier LSA (in response to a first select signal SEL1) or data output from the redundancy local input/output line sense amplifier RLSA (in response to a first select signal SEL1 and a second select signal SEL2).

The switch unit SW includes a first output unit SOUT1 (that outputs or cuts off the data output from the local input/output sense amplifier LSA in response to the first select signal SEL1) and a second output unit SOUT2 (that outputs or cuts off the data output from the redundancy local input/output line sense amplifier RLSA in response to the second select signal SEL2). The first select signal SEL1 has the opposite logic level as the second select signal SEL2. Accordingly, if the first output unit SOUT1 is turned on, then the second output unit SOUT2 is turned off. Likewise, if the first output unit SOUT1 is turned off, then the second output unit SOUT2 is turned on. The second select signal SEL2 is a column redundancy enable signal. If defects occur in a cell of the memory cell array block 710, the second select signal SEL2 is enabled. Once the second select signal SEL2 is enabled, the redundancy circuit 720 begins to operate.

If the redundancy circuit 720 operates, then the control unit CU generates (in response to the second select signal SEL2) a sense amplifier operation control signal OCTRL that disables the local input/output line sense amplifier LSA. The sense amplifier operation control signal OCTRL has the opposite logic level to that of the second select signal SEL2. If the second select signal SEL2 is enabled to a first level (i.e. the redundancy circuit 720 operates), then the sense amplifier operation control signal OCTRL is disabled. Since the sense amplifier operation control signal OCTRL has the opposite logic level to that of the second select signal SEL2, the control unit CU may (in embodiments) be an inverter INV.

Accordingly, the sense amplifier operation control signal OCTRL may be applied to the local input/output line sense amplifier LSA to disable the local input/output line sense amplifier LSA. The sense amplifier operation control signal OCTRL is applied to the local input/output line sense amplifier LSA via a transmission line TL located on the memory cell array block 710.

If the redundancy circuit 720 operates, the semiconductor memory device 700 inverts the enabled second select signal SEL2. The inverted second select signal SEL2 is applied to the local input/output line sense amplifier LSA of the memory cell array block 710 in order to connect a redundancy global input/output line RGIO and an inverted redundancy global input/output line RGIOB to an input/output line sense amplifier IOSA.

The local input/output line sense amplifier LSA may be disabled in response to the inverted second select signal SEL2. If the first select signal SEL1 is enabled and the second select signal SEL2 is disabled, the local input/output line sense amplifier LSA operates normally. However, if the first select signal SEL1 is disabled and the second select signal SEL2 is enabled, the local input/output line sense amplifier LSA does not operate, even though the sense amplifier enable signal PLIOSE is applied to the local input/output line sense amplifier LSA. Since the local input/output line sense amplifier LSA and the redundancy local input/output line sense amplifier RLSA are prevented from being simultaneously turned on in response to the sense amplifier enable signal PLIOSE, the semiconductor memory device 700 can prevent unnecessary current consumption.

If the redundancy circuit 720 does not operate, the control unit CU generates (in response to the second select signal SEL2) a redundancy sense amplifier operation control signal ROCTRL that disables the redundancy local input/output line sense amplifier RLSA. The redundancy sense amplifier operation control signal ROCTRL has the same logic level as the second select level SEL2. The redundancy sense amplifier operation control signal ROCTRL is applied to the redundancy local input/output line sense amplifier RLSA via a transmission line RTL located on the redundancy circuit 720.

If the memory cell array block 710 operates normally, the redundancy circuit 720 does not need to operate. Accordingly, the control unit CU applies the redundancy sense amplifier operation control signal ROCTRL to the redundancy local input/output line sense amplifier RLSA in order to prevent the local input/output line sense amplifier LSA and the redundancy local input/output line sense amplifier RLSA from being simultaneously turned on in response to the sense amplifier enable signal PLIOSE. Accordingly, if the first select signal SEL1 is enabled and the second select signal SEL2 is disabled, the redundancy local input/output line sense amplifier RLSA is also disabled.

Figure 8:
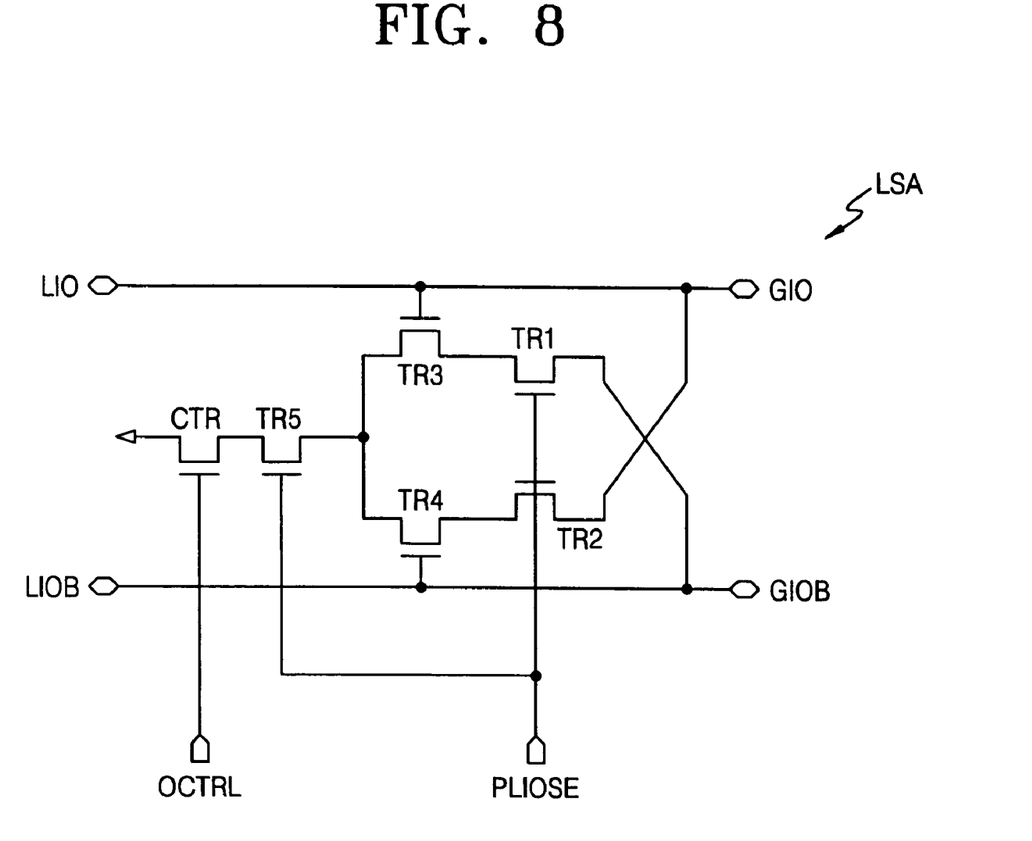
FIG. 8 is a circuit diagram of a local input/output line sense amplifier in a semiconductor memory device.

Example FIG. 8 is a circuit diagram (according to embodiments) of a local input/output line sense amplifier of the semiconductor memory device of FIG. 7. A local input/output line sense amplifier LSA includes first through fifth transistors TR1 through TR5 and a control transistor CTR. The first transistor TR1 has a first interface connected to an inverted global input/output line GIOB and a gate to which a sense amplifier enable signal PLIOSE is applied. The second transistor TR2 has a first interface connected to a global input/output line GIO and a gate to which the sense amplifier enable signal PLIOSE is applied. The third transistor TR3 has a first interface connected to a second interface of the first transistor TR1 and a gate to which data output from a local input/output line LIO is applied.

The fourth transistor TR4 has a first interface connected to a second interface of the second transistor TR2 and a gate to which inverted data output from an inverted local input/output line LIOB is applied. The fifth transistor TR5 has a first interface connected to both the second interface of the third transistor TR3 and the second interface of the fourth transistor TR4. The fifth transistor TR5 has a gate to which the sense amplifier enable signal PLIOSE is applied. The control transistor CTR has a first interface (connected to a second interface of the fifth transistor TR5), a gate (to which a sense amplifier operation control signal OCTRL is applied), and a second (connected to ground voltage VSS).

The structure of the local input/output line sense amplifier LSA of example FIG. 8 is similar to the local input/output line sense amplifier LSA of example FIG. 3, except that the local input/output line sense amplifier of example FIG. 8 includes the control transistor CTR. If the sense amplifier operation control signal OCTRL is enabled (at a high level), the control transistor CTR is turned on and the local input/output line sense amplifier LSA operates. In contrast, if the control transistor CTR is turned off, then the local input/output line sense amplifier LSA is also turned off. Accordingly, the local input/output line sense amplifier LSA can be selectively enabled or disabled since the control transistor CTR (that is controlled by the sense amplifier operation control signal OCTRL) is added to the local input/output line sense amplifier LSA. The structure of the redundancy local input/output line sense amplifier RLSA is similar to the local input/output line sense amplifier LSA of example FIG. 8.

Figure 9:
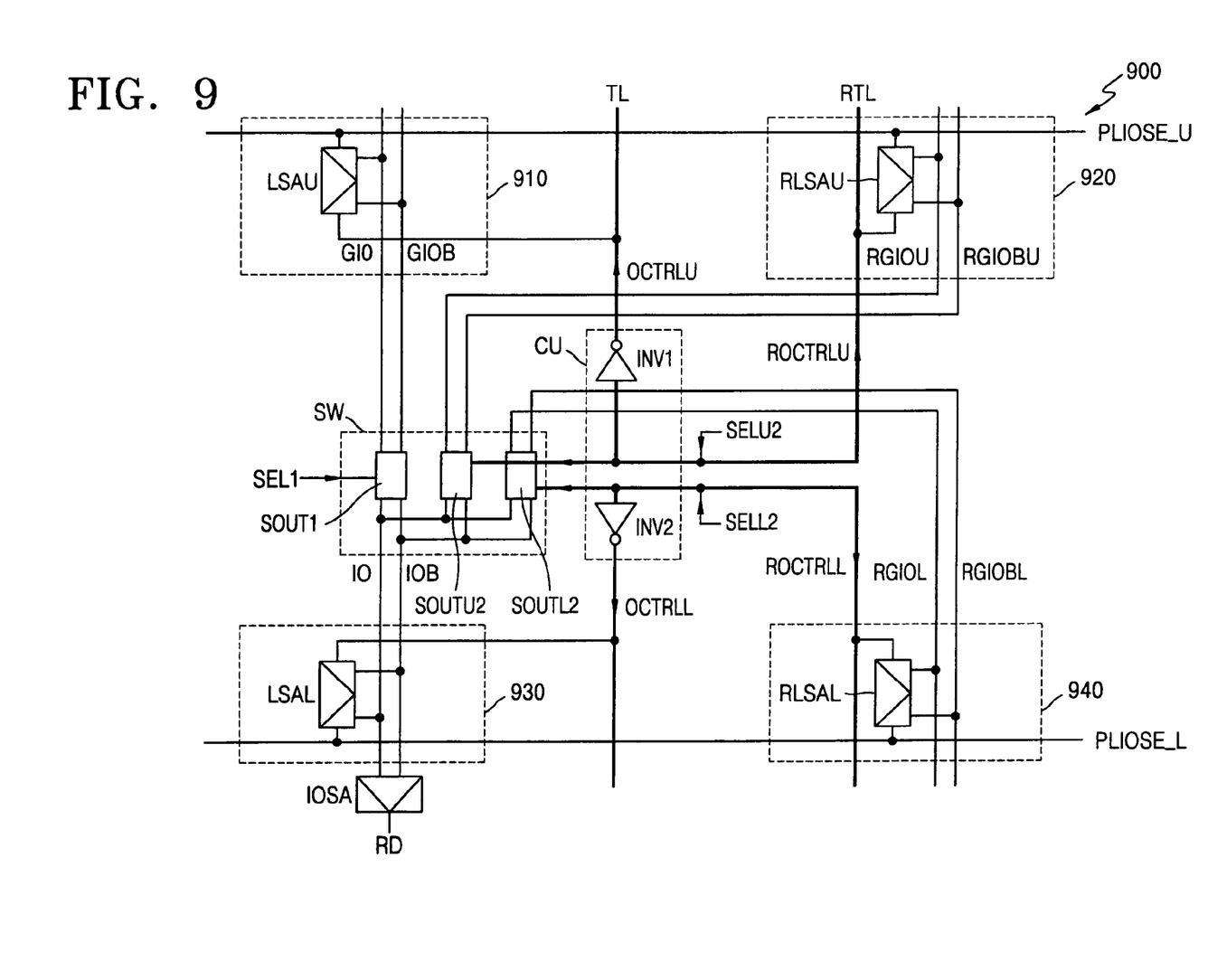
FIG. 9 is a circuit diagram of a semiconductor memory device.

Example FIG. 9 is a circuit diagram of a semiconductor memory device according to embodiments of the present invention. A semiconductor memory device 900 includes an upper memory cell array block 910, an upper redundancy circuit 920, a lower memory cell array block 930, a lower redundancy circuit 940, a switch unit SW, and a control unit CU. A memory cell, a bit line sense amplifier, and a redundancy bit line sense amplifier are not shown in the upper and lower redundancy circuits 920 and 940 and the upper and lower memory cell array blocks 910 and 930.

The upper memory cell array block 910 includes an upper local input/output line sense amplifier LSAU that operates in response to an upper sense amplifier enable signal PLIOSE_U. The upper redundancy circuit 920 includes an upper redundancy local input/output line sense amplifier RLSAU that operates in response to the upper sense amplifier enable signal PLIOSE_U. The lower memory cell array block 930 includes a lower local input/output line sense amplifier LSAL that operates in response to a lower sense amplifier enable signal PLIOSE_L. The lower redundancy circuit 940 includes a lower redundancy local input/output line sense amplifier RLSAL that operates in response to the lower sense amplifier enable signal PLIOSE_L.

The switch unit SW selectively outputs data output from the upper local input/output line sense amplifier LSAU, data output from the upper redundancy local input/output line sense amplifier RLSAU, or data output from the lower redundancy local input/output line sense amplifier RLSAL in response to a first select signal SEL1, a second upper select signal SELU2, and a second lower select signal SELL2. If the upper redundancy circuit 920 operates, then the control unit CU generates (in response to the second upper select signal SELU2) an upper sense amplifier operation control signal OCTRLU that disables the upper local input/output line sense amplifier LSAU. If the lower redundancy circuit 940 operates, then the control unit CU generates (in response to the second lower select signal SELL2) a lower sense amplifier operation control signal OCTRLL that disables the lower local input/output line sense amplifier LSAL.

The semiconductor memory device 900 of example FIG. 9 has a matrix structure. The memory cell array block is divided into the upper memory cell array block 910 and the lower memory cell array block 930. The redundancy circuit is also divided into the upper redundancy circuit 920 and the lower redundancy circuit 940. An input/output line IO and an inverted input/output line IOB of the lower memory cell array block 930 serve as a default path through which data output from the upper memory cell array block 910, the upper redundancy circuit 920, and the lower redundancy circuit 940 is transmitted to an input/output line sense amplifier IOSA. If the lower sense amplifier enable signal PLIOSE_L is enabled and the lower redundancy circuit 940 operates, then the lower local input/output line sense amplifier LSAL does not perform a dummy sensing function. The semiconductor memory device 900 of example FIG. 9 disable LSAL by use of the control unit CU.

If the lower redundancy circuit 940 operates, then only a second lower output unit SOUTL2 of the switch unit SW is turned on in response to the second lower select signal SELL2, while a first output unit SOUT1 and a second upper output unit SOUTU2 are turned off. Data amplified by the lower redundancy local input/output line sense amplifier RLSAL is transmitted to the input/output sense amplifier IOSA via a lower redundancy global input/output line RGIOL, an inverted lower redundancy global input/output line RGIOBL, and the second lower output unit SOUTL2. The control unit CU inverts the enabled second lower select signal SELL2 and outputs the inverted second lower select signal SELL2 as the lower sense amplifier operation control signal OCTRLL. The lower local input/output line sense amplifier LSAL is disabled in response to the lower sense amplifier operation control signal OCTRLL. Accordingly, even if the lower sense amplifier enable signal PLIOSE_L is enabled, the lower local input/output line sense amplifier LSAL does not operate, thereby preventing a dummy sensing problem. Since the lower sense amplifier operation control signal OCTRLL is generated by inverting the second lower select signal SELL2, the control unit CU may include a second inverter INV2.

If the upper memory cell array block 910 operates, then the control unit CU generates (in response to the second upper select signal SELU2) an upper redundancy sense amplifier operation control signal ROCTRLU that disables the upper redundancy local input/output line sense amplifier RLSAU. If the lower memory cell array block 930 operates, then the control unit CU generates (in response to the second lower select signal SELL2) a lower redundancy sense amplifier operation control signal ROCTRLL that disables the lower redundancy local input/output line sense amplifier RLSAL.

The upper redundancy sense amplifier operation control signal ROCTRLU has the same logic level as that of the second upper select signal SELU2. The lower redundancy sense amplifier operation control signal ROCTRLL has the same logic level as that of the second lower select signal SELL2. The operation of the semiconductor memory device 900 using the upper redundancy sense amplifier operation control signal ROCTRLU and the lower redundancy sense amplifier operation control signal ROCTRLL is similar to the semiconductor memory device 900 using the upper sense amplifier operation control signal OCTRLU and the lower sense amplifier operation control signal OCTRLL. The upper and lower local input/output line sense amplifiers LSAU and LSAL and the upper and lower redundancy local input/output line sense amplifiers RLSAU and RLSAL used in the semiconductor memory device 900 of example FIG. 9 are similar in structure to the semiconductor memory device of example FIG. 8.

Figure 10:
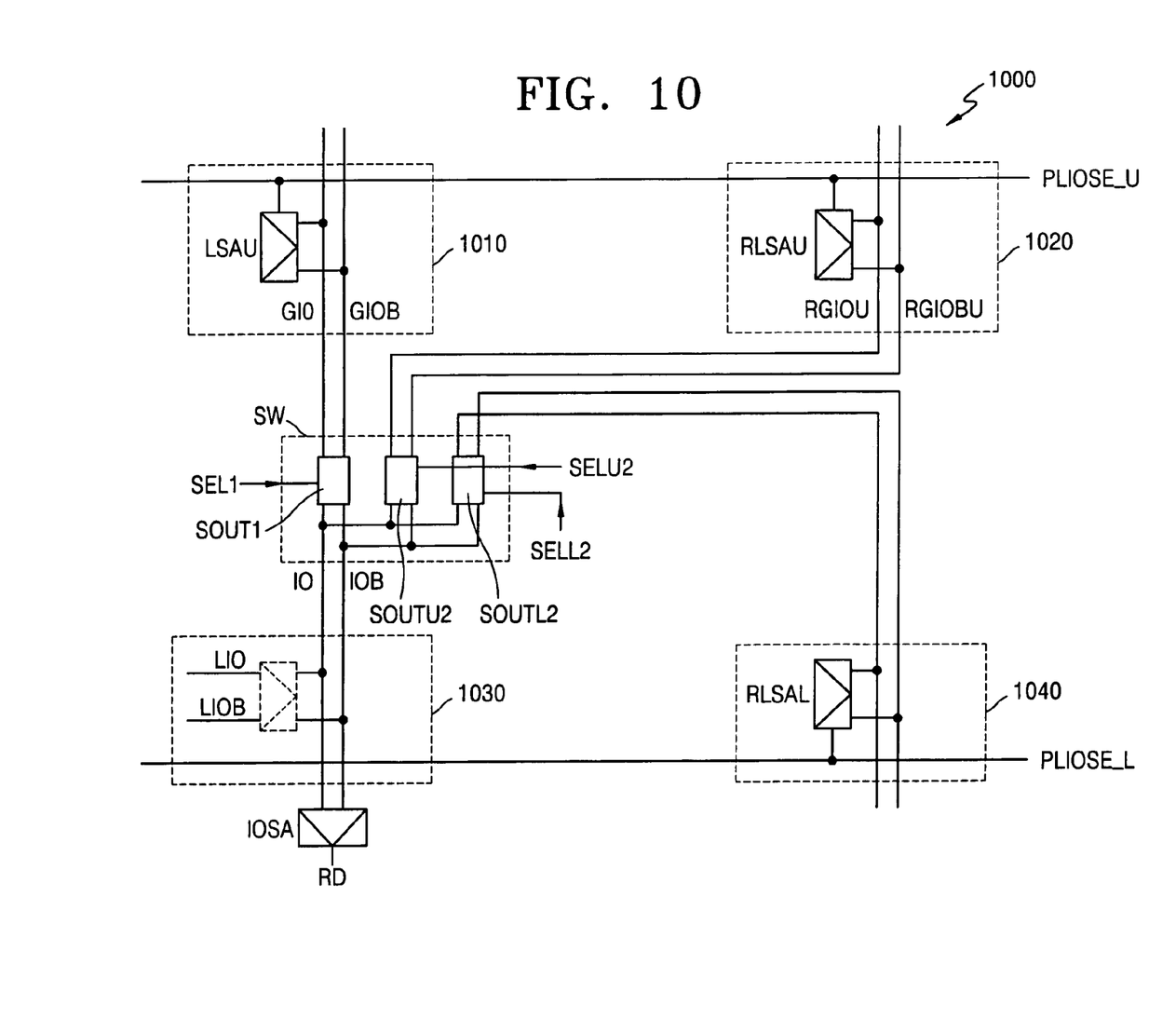
FIG. 10 is a circuit diagram of a semiconductor memory device.

Example FIG. 10 is a circuit diagram of a semiconductor memory device according to embodiments of the present invention. Referring to example FIG. 10, a semiconductor memory device 1000 includes an upper memory cell array block 1010, an upper redundancy circuit 1020, a lower memory cell array block 1030, a lower redundancy circuit 1040, and a switch unit SW. The upper memory cell array block 1010 includes an upper local input/output line sense amplifier LSAU that operates in response to an upper sense amplifier enable signal PLIOSE_U. The upper redundancy circuit 1020 includes an upper redundancy local input/output line sense amplifier RLSAU that operates in response to the upper sense amplifier enable signal PLIOSE_U.

The lower memory cell array block 1030 outputs stored data to an input/output line IO and an inverted input/output line IOB. The lower redundancy circuit 1040 includes a lower redundancy local input/output line sense amplifier RLSAL that operates in response to a lower sense amplifier enable signal PLIOS_L. The switch unit SW selectively outputs data output from the upper local input/output line sense amplifier LSAU, data output from the upper redundancy local input/output line sense amplifier RLSAU, or data output from the lower redundancy local input/output line sense amplifier RLSAL (in response to a first select signal SEL1, a second upper select signal SELU2, and a second lower select signal SELL2) to the input/output line IO and the inverted input/output line IOB. A local input/output line LIO and an inverted local input/output line LIOB in the lower memory cell array block 1030 are directly connected to the pair of input/output lines IO and IOB.

The upper memory cell array block 1010, the upper redundancy circuit 1020, and the lower redundancy circuit 1040 of the semiconductor memory device of example FIG. 10 have a similar structure as the upper memory cell array block 910, the upper redundancy circuit 920, and the lower redundancy circuit 940 of the semiconductor memory device of example FIG. 9. However, the structure of the lower memory cell array block 1030 of the semiconductor memory device 1000 of example FIG. 10 is different from the lower memory cell array block 930 of the semiconductor memory device 900 of example FIG. 9.

Referring to example FIG. 10, the lower memory cell array block 1030 does not include a lower local input/output line sense amplifier. The local input/output line LIO and the inverted local input/output line LIOB are directly connected to the pair of input/output lines IO and IOB, without passing through a lower local input/output line sense amplifier. Even if the lower redundancy circuit 1040 operates, (i.e. even if the lower sense amplifier enable signal PLIOSE_L is applied to the lower redundancy circuit 1040 and thus the lower redundancy local input/output lines sense amplifier RLSAL operates) dummy sensing (caused due to the lower local input/output line sense amplifier) does not occur since the lower local input/output line sense amplifier is not present in the semiconductor memory device 1000.

If the lower memory cell array block 1030 operates, then a first output unit SOUT1, a second upper output unit SOUTU2, and a second lower output unit SOUTL2 of the switch unit SW are disabled in response to the first select signal SEL1, the second upper select signal SELU2, and the second lower select signal SELL2. Therefore, only the resistance of the pair of input/output lines IO and IOB effects data loaded on the pair of local input/output lines LIO and LIOB. Although the data loaded on the pair of local input/output lines LIO and LIOB is not amplified by the lower local input/output line sense amplifier, the data can be transmitted to an input/output sense amplifier IOSA without reducing speed. Since the removed local input/output sense amplifier would be located near to the input/output sense amplifier, current consumption is reduced and an efficient read data path is achieved.

Figure 11:
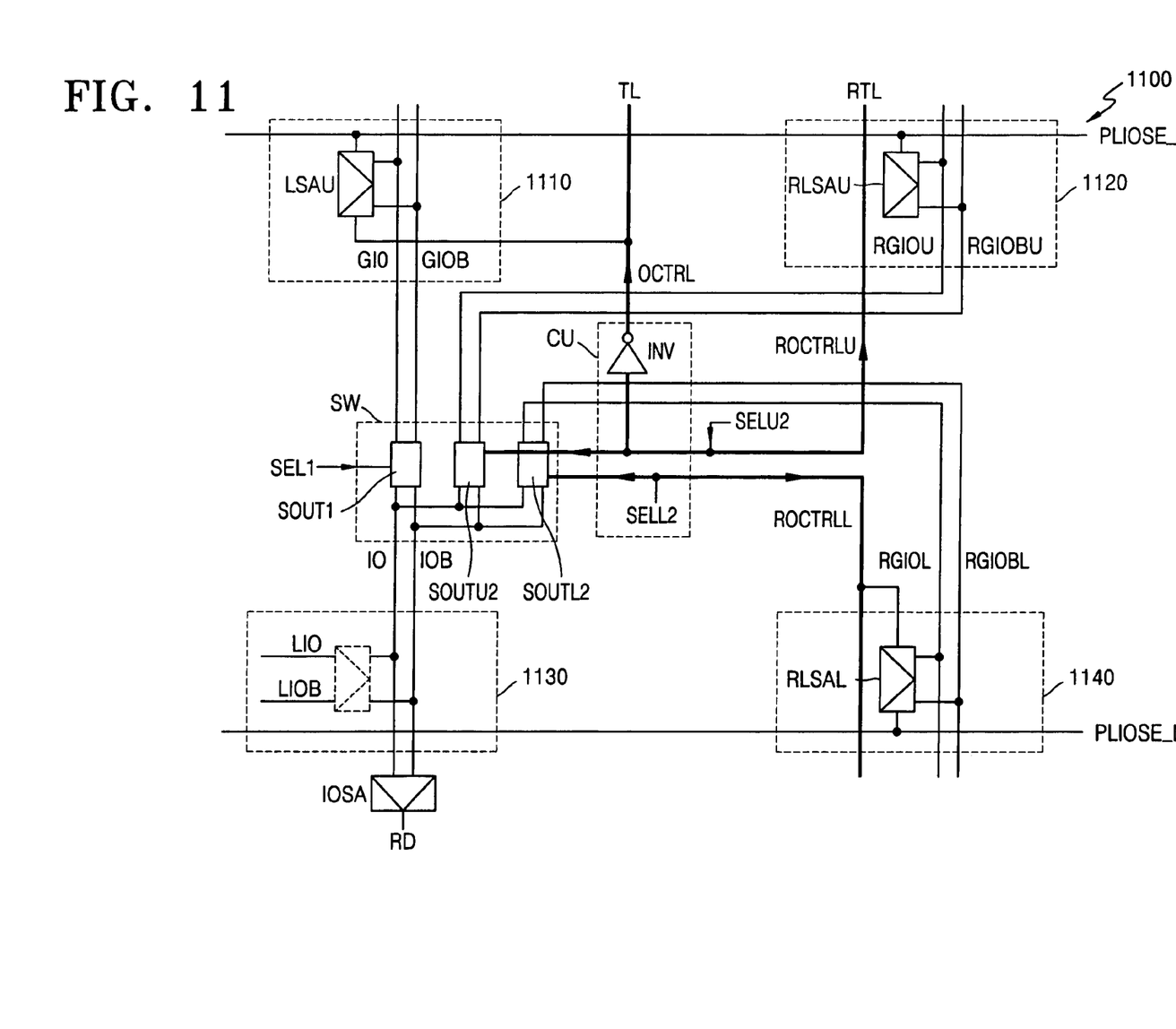
FIG. 11 is a circuit diagram of a semiconductor memory device comprising a control unit.

Example FIG. 11 is a circuit diagram of a semiconductor memory device as shown in example FIG. 10, which includes a control unit, in accordance with embodiments of the present invention. A semiconductor memory device 1100 includes a control unit CU. If an upper redundancy circuit 1120 operates, then the control units CU generates (in response to a second upper select signal SELU2) an upper sense amplifier operation control signal OCTRL that disables an upper local input/output line sense amplifier LSAU.

The upper sense amplifier operation control signal OCTRL has the opposite logic level as the second upper select signal SELU2. If the second upper select signal SELU2 is enabled to a high level, then the upper sense amplifier operation control signal OCTRL is generated at a low level to disable the upper local input/output line sense amplifier LSAU. The control unit CU may include an inverter INV that inverts the second upper select signal SELU2 which generates the upper sense amplifier operation control signal OCTRL.

If an upper memory cell array block 1110 operates, then the control unit CU generates (in response to the second upper select signal SELU2) an upper redundancy sense amplifier operation control signal ROCTRLU that disables an upper redundancy local input/output line sense amplifier RLSAU. If a lower memory cell array block 1130 operates, then the control unit CU generates (in response to a second lower select signal SELL2) a lower redundancy sense amplifier operation control signal ROCTRLL that disables a lower redundancy local input/output line sense amplifier RLSAL.

The upper redundancy sense amplifier operation control signal ROCTRLU has the same logic level as the second upper select signal SELU2. The lower redundancy sense amplifier operation control signal ROCTRLL has the same logic level as that of the second lower select signal SELL2. The operation of the control unit CU to generate the upper redundancy sense amplifier operation control signal ROCTRLU and the lower redundancy sense amplifier operation control signal ROCTRLL is similar to the control unit CU of example FIG. 9.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A semiconductor memory device which selectively controls a local input/output line sense amplifier, wherein the semiconductor memory device comprises:
    a memory cell array block, which includes a local input/output line sense amplifier which operates in response to a sense amplifier enable signal;
    a redundancy circuit, which includes a redundancy local input/output line sense amplifier which operates in response to the sense amplifier enable signal;
    a switch unit, which selectively outputs data output from the local input/output line sense amplifier or the redundancy local input/output line sense amplifier in response to a first select signal and a second select signal; and
    a control unit which generates in response to the second select signal a sense amplifier operation control signal that disables the local input/output line sense amplifier, if the redundancy circuit operates.

2. The semiconductor memory device of claim 1, wherein the control unit generates, in response to the second select signal, a redundancy sense amplifier operation control signal that disables the redundancy local input/output line sense amplifier, if the redundancy circuit does not operate.

3. The semiconductor memory device of claim 2, wherein the redundancy local input/output line sense amplifier comprises:
    a first redundancy transistor, which has a first interface connected to a redundancy inverted global input/output line and a gate to which the sense amplifier enable signal is applied;
    a second redundancy transistor, which has a first interface connected to a redundancy global input/output line and a gate to which the sense amplifier enable signal is applied;
    a third redundancy transistor, which has a first interface connected to a second interface of the first redundancy transistor and a gate to which the data output from a redundancy local input/output line is applied;
    a fourth redundancy transistor, which has a first interface connected to a second interface of the second redundancy transistor and a gate to which inverted data output from a redundancy inverted local input/output line is applied;
    a fifth redundancy transistor, which has a first interface connected to both the second interface of the third redundancy transistor and the second interface of the fourth redundancy transistor, and a gate to which the sense amplifier enable signal is applied; and
    a redundancy control transistor, which has a first interface connected to a second interface of the fifth redundancy transistor, a gate to which the redundancy sense amplifier operation control signal is applied, and a second interface is connected to a ground voltage.

4. The semiconductor memory device of claim 2, wherein the redundancy sense amplifier operation control signal has the same logic level as that of the second select signal.

5. The semiconductor memory device of claim 2, wherein the redundancy sense amplifier operation control signal is applied to the redundancy local input/output line sense amplifier via a transmission line located on the redundancy circuit.

6. The semiconductor memory device of claim 1, wherein the first select signal has the opposite logic level as the second select signal, the second select signal is a column redundancy enable signal, and the sense amplifier operation control signal has the opposite logic level as the second select signal.

7. The semiconductor memory device of claim 1, wherein the switch unit comprises:
    a first output unit, which outputs or cuts off the data output from the local input/output sense amplifier in response to the first select signal; and
    a second output unit, which outputs or cuts off the data output from the redundancy local input/output sense amplifier in response to the second select signal.

8. The semiconductor memory device of claim 1, wherein the local input/output line sense amplifier comprises:
- a first transistor, which has a first interface connected to an inverted global input/output line and a gate to which the sense amplifier enable signal is applied;
- a second transistor, which has a first interface connected to a global input/output line and a gate to which the sense amplifier enable signal is applied;
- a third transistor, which has a first interface connected to a second end of the first transistor and a gate to which the data output from a local input/output line is applied;
- a fourth transistor, which has a first interface connected to a second interface of the second transistor and a gate to which inverted data output from an inverted local input/output line is applied;
- a fifth transistor, which has a first interface connected to both the second interface of the third transistor and the second interface of the fourth transistor, and a gate to which the sense amplifier enable signal is applied; and
- a control transistor, which has a first interface connected to a second interface of the fifth transistor, a gate to which the sense amplifier operation control signal is applied, and a second interface connected to a ground voltage.

9. The semiconductor memory device of claim 1, wherein the sense amplifier operation control signal is applied to the local input/output line sense amplifier via a transmission line located on the memory cell array block.

10. A semiconductor memory device which selectively controls a local input/output line sense amplifier, wherein the semiconductor memory device comprises:
- an upper memory cell array block, which includes an upper local input/output line sense amplifier which operates in response to an upper sense amplifier enable signal;
- an upper redundancy circuit, which includes an upper redundancy local input/output line sense amplifier which operates in response to the upper sense amplifier enable signal;
- a lower memory cell array block, which includes a lower local input/output line sense amplifier which operates in response to a lower sense amplifier enable signal;
- a lower redundancy circuit, which includes a lower redundancy local input/output line sense amplifier that operates in response to the lower sense amplifier enable signal;
- a switch unit, which selectively outputs data output from the upper local input/output line sense amplifier, the upper redundancy local input/output line sense amplifier, or the lower redundancy local input/output line sense amplifier in response to a first select signal, a second upper select signal, and a second lower select signal; and
- a control unit which:
  - generates, in response to the second upper select signal, an upper sense amplifier operation control signal which disables the upper local input/output line sense amplifier, if the upper redundancy circuit operates; and
  - generates, in response to the second lower select signal, a lower sense amplifier operation control signal which disables the lower local input/output line sense amplifier, if the lower redundancy circuit operate.

11. The semiconductor memory device of claim 10, wherein:
- the control unit generates, in response to the second upper select signal, an upper redundancy sense amplifier operation control signal which disables the upper redundancy local input/output line sense amplifier, if the upper memory cell array block operates; and
- the control unit generates, in response to the second lower select signal, a lower redundancy sense amplifier operation control signal which disables the lower redundancy local input/output line sense amplifier, if the lower memory cell array block operates.

12. The semiconductor memory device of claim 11, wherein the upper redundancy sense amplifier operation control signal has the same logic level as the second upper select signal, and the lower redundancy sense amplifier operation control signal has the same logic level as the second lower select signal.

13. The semiconductor memory device of claim 11, wherein:
- the upper redundancy sense amplifier operation control signal is applied to the upper redundancy local input/output line sense amplifier via a transmission line located on the upper redundancy circuit; and
- the lower redundancy sense amplifier operation control signal is applied to the lower redundancy local input/output line sense amplifier via a transmission line located on the lower redundancy circuit.

14. The semiconductor memory device of claim 10, wherein if one of the first select signal, the second upper select signal, and the second lower select signal is at a first level, the other two signals are at a second level.

15. The semiconductor memory device of claim 10, wherein:
- the upper sense amplifier operation control signal has the opposite logic level to that of the second upper select signal; and
- the lower sense amplifier operation control signal has the opposite logic level to that of the second lower select signal.

16. The semiconductor memory device of claim 10, wherein the switch unit comprises:
- a first output unit, which outputs or cuts off the data output from the upper local input/output sense amplifier in response to the first select signal;
- a second upper output unit, which outputs or cuts off the data output from the upper redundancy local input/output sense amplifier in response to the second upper select signal; and
- a second lower output unit, which outputs or cuts off the data output from the lower redundancy local input/output sense amplifier in response to the second lower select signal.

17. The semiconductor memory device of claim 10, wherein:
- the upper sense amplifier operation control signal is applied to the upper local input/output line sense amplifier via a transmission line located on the upper memory cell array block; and
- the lower sense amplifier operation control signal is applied to the lower local input/output line sense amplifier via a transmission line located on the lower memory cell array block.

18. A semiconductor memory device which selectively controls a local input/output line sense amplifier, the semiconductor memory device comprising:

an upper memory cell array block, which includes an upper local input/output line sense amplifier that operates in response to an upper sense amplifier enable signal;

a redundancy circuit, which includes an upper redundancy local input/output line sense amplifier that operates in response to the upper sense amplifier enable signal;

a lower memory cell array block, which outputs stored data to an input/output line;

a lower redundancy circuit, which includes a lower redundancy local input/output line sense amplifier that operates in response to the lower sense amplifier enable signal;

a switch unit, which selectively outputs data output from the upper local input/output line sense amplifier, the upper redundancy local input/output line sense amplifier, or the lower redundancy local input/output line sense amplifier in response to a first select signal, a second upper select signal, and a second lower select signal; and a local input/output line directly connected to the input/output line.

19. The semiconductor memory device of claim 18, wherein the switch unit comprises:

a first output unit, which outputs or cuts off, in response to the first select signal, the data output from the upper local input/output sense amplifier to or from the input/output line;

a second output unit, which outputs or cuts off, in response to the second upper select signal, the data output from the upper redundancy local input/output sense amplifier to or from the input/output line; and a second lower output unit, which outputs or cuts off, in response to the second lower select signal, the data output from the lower redundancy local input/output sense amplifier to or from the input/output line.

20. The semiconductor memory device of claim 18, further comprising a control unit, which generates, in response to the second upper select signal, an upper sense amplifier operation control signal that disables the upper local input/output line sense amplifier, if the upper redundancy circuit operates.

21. The semiconductor memory device of claim 20, wherein:

if one of the first select signal, the second upper select signal, and the second lower select signal is at a first level, the other two signals are at a second level; and the upper sense amplifier operation control signal has the opposite logic level as the second upper select signal.

22. The semiconductor memory device of claim 20, wherein the upper sense amplifier operation control signal is applied to the upper local input/output line sense amplifier via a transmission line located on the upper memory cell array block.

23. The semiconductor memory device of claim 20, wherein:

if the upper memory cell array block operates, the control unit generates, in response to the second upper select signal, an upper redundancy sense amplifier operation control signal which disables the upper redundancy local input/output line sense amplifier; and if the lower memory cell array block operates, the control unit generates, in response to the second lower select signal, a lower redundancy sense amplifier operation control signal which disables the lower redundancy local input/output line sense amplifier.

24. The semiconductor memory device of claim 23, wherein:

the upper redundancy sense amplifier operation control signal has the same logic level as the second upper select signal; and the lower redundancy sense amplifier operation control signal has the same logic level as the second lower select signal.

25. The semiconductor memory device of claim 23, wherein:

the upper redundancy sense amplifier operation control signal is applied to the upper redundancy local input/output line sense amplifier via a transmission line located on the upper redundancy circuit; and the lower redundancy sense amplifier operation control signal is applied to the lower redundancy local input/output line sense amplifier via a transmission line located on the lower redundancy circuit.

* * * * *